United States Patent [19]

Chen et al.

[11] Patent Number: 5,025,165
[45] Date of Patent: Jun. 18, 1991

[54] METHOD FOR PRODUCING A SEMICONDUCTOR DEVICE USING AN ELECTRON BEAM EXPOSURE TOOL AND APPARATUS FOR PRODUCING THE DEVICE

[75] Inventors: Chin-Chin Chen, Scotch Plains, N.J.; Martin Feldman, Baton Rouge, La.; Herbert A. Waggener, Pottersville, N.J.

[73] Assignee: AT&T Bell Laboratories, Murray Hill, N.J.

[21] Appl. No.: 499,153

[22] Filed: Mar. 26, 1990

[51] Int. Cl.$^5$ .............................................. H01J 37/20
[52] U.S. Cl. ................................ 250/491.1; 250/442.1
[58] Field of Search ........................ 250/491.1, 442.1; 219/121.23

[56] References Cited

U.S. PATENT DOCUMENTS

| 4,334,139 | 6/1982 | Wittekoek et al. | 250/491.1 |
| 4,468,565 | 8/1984 | Blair et al. | 250/491.1 |
| 4,728,193 | 3/1988 | Bartelt | 356/356 |
| 4,828,392 | 5/1989 | Nomura et al. | 356/401 |

FOREIGN PATENT DOCUMENTS

0094742  7/1981  Japan ................................ 250/491.1

OTHER PUBLICATIONS

*Semiconductor International*, vol. 10, No. 2, 1987, by P. Burggraaf, pp. 48-55.
*Optical Microlithography IV, Proceedings of SPIE-The International Society for Optical Engineering*, vol. 538, 1985, S. Wittekoek et al., pp. 24-31.
Optical Microlithorgraphy VI, Proceedings of SPIE-The International Society For Optical Engineering, vol. 772, M. A. van den Brink et al., pp. 100-117, 1987 (pp. 1-18).

*Primary Examiner*—Bruce C. Anderson
*Attorney, Agent, or Firm*—E. E. Pacher

[57] ABSTRACT

Conventional alignment procedures in electron beam (e-beam) direct write systems typically use an e-beam exposure tool as a scanning electron microscope (SEM) to imagine wafer alignment marks. However, electrical charging of the wafer surface by the electron beam can typically result in image distortions which generally can lead to alignment inaccuracies. The inventive method and apparatus advantageously overcome the alignment inaccuracies associated with the charging effects, by optically aligning the wafer to a reference axis of the electron beam. In a preferred embodiment of this invention, light is focused on a diffraction grating on the wafer, used as an alignment mark, and the diffracted light is spatially filtered and detected. Spatially filtering the diffracted light, eliminating the 0th order of the diffracted light, provides increased depth of focus. Also in this particular embodiment, travel of the wafer stage for optical alignment remains below the electron lens column by mounting an optical head (used for directing light onto the wafer, for spatially filtering the diffracted light, and for directing the spatially filtered light to the detection means) to the pole tip of the electron lens column. Significantly, the optical head comprises a lens section cut from a relatively larger lens providing a large working distance and numerical aperture without restricting movement, below the pole tip, of the wafer stage with a wafer mounted thereon.

9 Claims, 2 Drawing Sheets

METHOD FOR PRODUCING A SEMICONDUCTOR DEVICE USING AN ELECTRON BEAM EXPOSURE TOOL AND APPARATUS FOR PRODUCING THE DEVICE

TECHNICAL FIELD

This invention pertains to semiconductor device processing. In particular, it pertains to a manufacturing method that comprises electron beam lithography, and to apparatus for electron beam lithography.

BACKGROUND OF THE INVENTION

Consumer demands for higher capacity and/or faster operating electronic systems are driving the semiconductor industry to develop integrated circuits (ICs) that generally are denser and/or operate faster than the present generation ICs. These advanced design ICs have critical feature lengths typically less than 0.5 μm, a length at which conventional optical lithography is typically at its operational limits. Optical lithography refers to a general technique for patterning a photoresist, typically a thin photosensitive polymer, using actinic radiation in the optical region of the electromagnetic spectrum to form a masking layer that selectively protects underlying material against chemical or physical attack during IC fabrication. In general, lithography in the semiconductor industry is the art of producing patterns in films (herein these films are known as resist material or simply resist) that can be used as a masking layer in processing integrated circuits. Each lithographic technique typically employs a characteristic actinic radiation.

The minimum feature length that can be attained in an IC typically depends on the wavelength of the actinic radiation used to expose the resist. To attain feature lengths smaller than 0.5 μm (a process capable of producing feature lengths smaller than 0.5 μm is herein referred to as a sub-half-micron process) generally requires the lithographic use of actinic radiation having wavelengths smaller than used in conventional optical lithography. As a result, innovative optical techniques and other lithographic technologies, utilizing radiation of appropriately small characteristic wavelengths, are being developed to produce these integrated circuits. The emerging technologies include, among others, electron beam (e-beam) direct write lithography, ion beam lithography, laser-based deep-uv lithography, and x-ray lithography. Of these technologies, e-beam lithography probably is the most mature, already having application to low volume IC production and to IC prototyping, though it has not yet been accepted for high volume production of integrated circuits, since the throughput of direct-write e-beam lithography is relatively slow. For a discussion of several emerging lithographic technologies, see P. Burggraaf, *Semiconductor International*, Vol. 10, No. 2, pp. 48–55, 1987.

The apparatus used in electron beam lithography is typically referred to as an electron beam (e-beam) exposure tool. The e-beam exposure tool provides a focused electron beam to form a pattern, typically, in a polymeric resist film or multilayer film structure on a semiconductor substrate, commonly known as a wafer. Typically, the pattern forms as a result of microstructural changes, such as polymer chain scission in positive resists or polymer chain cross-linking in negative resists, in response to irradiation by the electron beam. The patterns in the resist film produced by the microstructural changes have differing solubility rates corresponding to the electron beam exposure pattern. Appropriate solvents are used to process the desired pattern, by removing unwanted material layers on the wafer, forming a resist masking layer. E-beam lithography can be used to produce feature sizes of less than 0.5 μm.

In sub-half-micron processes involved with fabricating an advanced IC, aligning different levels of the IC structure, i.e., centering a level to a previous level, is critical. Conventional alignment procedures for e-beam exposure tools typically use the e-beam tool as a scanning electron microscope (SEM) to image an alignment mark provided on a wafer. By referencing each level to the same alignment mark, the levels can be aligned to each other. Unfortunately, using the e-beam exposure tool in the SEM mode for imaging the wafer alignment mark frequently leads to electrically charging the wafer surface, due to the electron beam interacting with non-metallic materials on the surface. Surface charging typically results in image distortions which generally lead to alignment inaccuracies.

The charging effects can be substantially reduced or eliminated by providing a conductive top layer on the portions of the wafer to be aligned. This layer prevents charging by providing a conductive path to remove excess charge from the wafer surface. However, the presence of this conductive layer is typically temporary, involving additional processing steps to deposit and later remove it. Charging can also be substantially reduced by operating the exposure tool at electron energies where the secondary electron emission ratio is one (typically at 1 to 2 KeV). However, this procedure can expose the resist to irradiation before the wafer has been properly aligned and positioned, which can lead to unwanted microstructural changes in the resist material.

SUMMARY OF THE INVENTION

In a broad aspect, the invention is a method of producing semiconductor devices that comprises electron-beam lithography capable of producing devices having sub-half-micron device features. The inventive method is applicable to producing discrete semiconductor devices and to producing integrated circuits comprising a multiplicity of semiconductor devices.

More particularly, the inventive method comprises e-beam lithography that comprises optical alignment of a semiconductor body, and thereby can overcome the above referred to charging problems frequently associated with prior art e-beam lithography.

Still more particularly, the inventive method comprises providing a semiconductor body with a processing layer (also referred to herein as a resist layer) and at least one alignment mark on a major surface of the body, introducing the body into an e-beam exposure tool, aligning the body with respect to an electron beam reference axis associated with the e-beam exposure tool, exposing a selected portion of the processing layer to an electron beam, and carrying out one or more further steps towards completion of the device. The e-beam exposure tool comprises optical alignment means, and aligning the body with respect to the e-beam reference axis comprises aligning the body with respect to a beam of optical radiation associated with the optical alignment means, the optical beam being a predetermined distance in a predetermined direction from the e-beam reference axis. Alignment with respect to the e-beam reference axis further comprises moving the body, aligned to the optical beam, in the e-beam exposure tool such that the portion of the body selected for exposure to the e-beam is aligned to the e-beam reference axis. In particular, the selected portion of the body can be aligned by moving the optically aligned body the predetermined distance in the predetermined direction to align the alignment mark to the e-beam reference axis, and then, since the selected portion of the body to be exposed is a known distance in a known direction from the alignment mark, the body is moved the known distance in the known direction to align the selected portion of the body with the electron beam reference axis. In a preferred embodiment, the predetermined distance and direction from the optical beam to the e-beam reference axis defines a reference vector, and the known distance and direction from the alignment mark to the selected portion of the body defines an alignment vector. The vectorial sum of the reference and alignment vector determines the direction and distance required to move the semiconductor body from its position aligned to the optical beam to a position for exposing the selected portion of the body to the e-beam.

Typically, an alignment mark comprises a series of parallel lines, frequently referred to as a diffraction grating. In many cases two diffraction gratings, with mutually orthogonal lines, are grouped together, as will be described below.

Exemplary of the one or more further processing steps are removal of portions of the processing layer by means of an appropriate "etching" technique, ion implantation, and metal layer deposition.

In a further aspect, the invention is an electron beam exposure tool that comprises optical alignment means such that the exposure tool can be used to practice the inventive method. In a particular and currently preferred embodiment of the invention the optical alignment means comprise means for generating a beam of optical radiation (e.g., a HeNe laser external to the vacuum chamber of the exposure tool) and an "optical head" mounted to the pole tip of the electron beam exposure tool. This placement, made possible by novel features of the optical head that will be discussed below in detail, eliminates the inordinate amount of travel a stage, holding a semiconductor body, would undergo to move the semiconductor body from its position aligned with the optical beam to the desired position for e-beam exposure, if the optical head were mounted in an alternate position. Significantly, the optical head provides the relatively large depth of focus necessary to be used in conjunction with the e-beam. The depth of focus of an optical beam used for alignment in a conventional optical lithographic system is typically smaller than that of an e-beam in a conventional e-beam exposure tool. Since the depth of focus of an optical beam is relatively small, imaging a body surface having topological variations requires refocusing the optical beam by moving the lens position or object position to maintain a constant distance between the body surface and the optical lens. However, the electron beam in a conventional e-beam exposure tool, besides having a relatively large depth of focus, can be refocused, by changing current and/or voltage levels in the electrons lens, without the need to maintain a constant distance between the body surface and the pole tip. Thus, an optical alignment system mounted to the pole tip of a conventional electron lens column will typically not maintain a constant distance between the body surface and the lens of the optical alignment system, and will typically need to comprise means for providing a relatively large depth of focus. In a currently preferred embodiment of the inventive method, the optical head spatially filters light diffracted from the body surface to provide a relatively large depth of focus.

Significantly, the novel alignment means can be incorporated into many (probably all) standard e-beam exposure tool designs conventionally comprising a vacuum chamber, means for generating an electron beam, a wafer stage, and means for loading wafers into the vacuum chamber. Associated with the electron beam of the e-beam exposure tool is a known fixed axis, which has previously been referred to as the electron beam reference axis. Typically, the electron beam can be moved, or rastered, about its e-beam reference axis.

Significantly, the inventive method and apparatus provide a process for aligning a wafer to an electron beam without charging the wafer, and without exposing material layers on the wafer to the electron beam prior to alignment.

Figure 1:
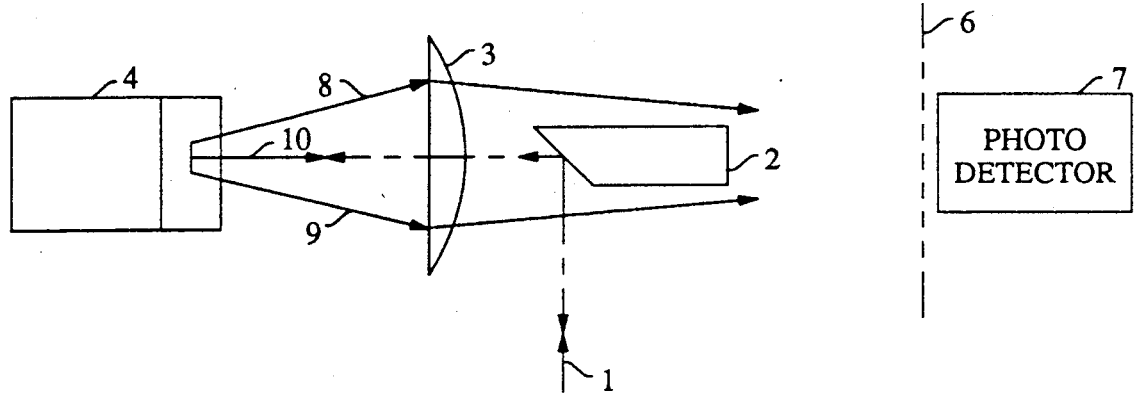
FIG. 1 schematically depicts a top view of an exemplary means for directing light to a wafer and for spatially filtering diffracted light from the wafer.

No attempt has been made to present true proportions or dimensions.

DETAILED DESCRIPTION

In a particular embodiment, the inventive method is applied to a semiconductor body comprising a wafer as conventionally used in the manufacture of integrated circuits. Although the inventive method is not limited to application with conventional semiconductor wafers, the discussions herein will be primarily in terms of conventional semiconductor wafers.

In an e-beam lithographic process, wafer alignment for exposing individual wafer sites to an e-beam can be facilitated typically using one of several general procedures. In a site by site (die by die) alignment procedure, the starting location for e-beam exposure is selected relative to an alignment mark at a particular wafer site, requiring an alignment mark for each site being processed. Using a strict global alignment procedure the starting location for e-beam exposure is selected relative to two alignment marks for all sites being processed, while in a modified global alignment procedure, more than two alignment marks are used, but not one at every wafer site.

In a particular embodiment of the inventive method, a form of modified global alignment procedure is used for aligning specified portions of a wafer with the e-beam reference axis. However, prior to aligning a wafer with the e-beam reference axis, the relative location of the optical beam with respect to the e-beam reference axis is determined, typically using a standard reference mark provided on a wafer stage (or wafer cassette) that can be aligned both to an optical beam and an electron beam. The reference mark on the wafer stage (or wafer cassette) is first moved to a position where it is aligned, using a conventional e-beam alignment technique, to a fixed electron beam, defining the electron beam reference axis. The wafer stage (or wafer cassette) is then moved such that the mark is aligned to the optical beam. With a very precise interferometric stage used as the wafer stage, moving the reference mark on the stage from the e-beam reference axis to the optical beam determines the relative location of the optical beam with respect to the e-beam reference axis, defining a reference vector. The reference vector can also be determined using two marks on the wafer stage (or wafer cassette) at a known distance apart, where one mark is aligned to the e-beam reference axis and the other mark is aligned optically. Of course, unless elements of the exposure tool and/or the optical alignment means are rearranged such as to alter the location of the optical beam relative to the e-beam reference axis, this relative location typically does not vary while exposing resist on a wafer to the electron beam, and does not need to be determined for aligning each wafer site for e-beam exposure.

After determining the above discussed reference vector, a wafer, provided with optical alignment marks and placed on the wafer stage, is moved under the optical beam. A wafer alignment mark is aligned to the optical beam and, typically, the wafer distortion is determined in a conventional manner known to those skilled in the art. Translating the alignment mark from the optically aligned location the distance and direction defined by the reference vector aligns the wafer alignment mark to the e-beam reference axis. Those skilled in the art will appreciate that this technique is not restricted for use in a modified global alignment procedure, but is also applicable to site by site alignment and to strict global alignment.

For optical alignment to the e-beam reference axis without extended travel of the wafer stage, the optical system should operate in the narrow gap between the pole tip and the wafer. In a preferred embodiment of the inventive method, an optical head comprising small optical elements is mounted to the bottom of the pole tip, eliminating the need for the stage to move from below the pole tip. An optical beam is reflected onto the wafer from a set of mirrors and through a lens within the optical head. Significantly, the lens is a section sliced from a relatively large lens, such that the lens is relatively small in the direction perpendicular to the optical beam. In one embodiment, mirrors are sliced from a larger prism at a 45° angle. Advantageously, this combination of lens and mirror maintains a high numerical aperture, and provides a long working distance. These optical elements are limited to small thicknesses, maintaining clearance between the pole tip and the wafer (or wafer cassette if the wafer is placed in the cassette such that the wafer is recessed from the top of the cassette). The numerical aperture generally ranges from 0.05 to 1, more typically in the range 0.1 to 0.5, while the working distance, being slightly greater than the separation between the wafer (or wafer cassette) and the pole tip, is typically between 0.5 and 0.75 cm.

In a preferred embodiment, a large depth of focus is obtained by spatially filtering the light diffracted from a grating, used as a wafer alignment mark, eliminating the 0th diffraction order, and producing a high contrast grating image having half the period of the image that would occur if the 0th diffraction order were not filtered. Spatial filtering using only the first diffracted orders of a phase grating (eliminating the 0th diffraction order) can provide a sinusoidal modulation of the alignment mark image with a 100 percent contrast (modulation depth). An optical alignment method using such spatial filtering has been developed for an optical step and repeat camera. See, for instance, S. Wittekoek et al., *Optical Microlithography IV, Proceedings of SPIE - The International Society for Optical Engineering*, Vol. 538, pp. 24–31, 1985, and M. A. van den Brink et al, *Optical Microlithography VI, Proceedings of SPIE - The International Society for Optical Engineering*, Vol. 772, pp. 100–117, 1987. In these optical exposure tools, part of the same lens used for site exposure is used for alignment. The prior art procedure is well suited for optical step and repeat cameras but is not adaptable for use with an e-beam exposure tool.

Figure 2:
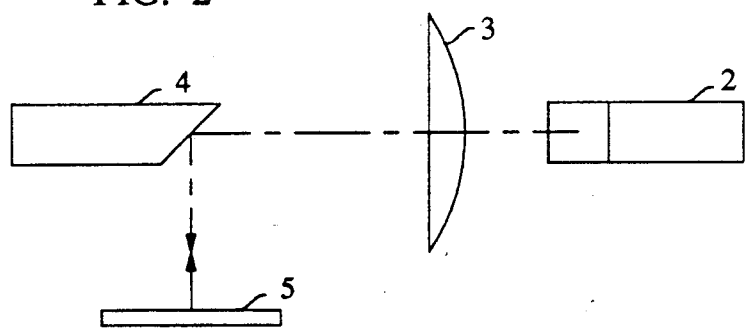
FIG. 2 schematically represents a partial side view of the exemplary means of FIG. 1 depicting the directing of light onto a wafer.

FIG. 1 schematically depicts a top view of a means for directing light onto a wafer and for spatially filtering light diffracted from the wafer in accordance with the inventive method. A partial side view of the means is schematically shown in FIG. 2 depicting the directing of light onto a wafer. A laser source (not shown) provides light which is formed into a converging beam 1 of f/100 by an upstream lens (not shown). The beam is reflected from a 45° mirror 2, a section cut from a 45° prism, to the lens section 3, an approximately 0.25 cm thick section cut from a 12.7 mm focal length lens, placed approximately one focal length away from the wafer 5. Another 45° mirror 4, similar to mirror 2, directs the light from the lens to the wafer, where the light illuminates a region of the wafer, exemplarily a 120 $\mu$m diameter region. A wafer alignment mark (not shown) is provided on the wafer in the form of a diffraction grating approximately 100 $\mu$m wide and 100 $\mu$m long so that the illuminated region is only slightly larger than the alignment mark. This configuration of lenses and mirrors can result in a depth of focus of approximately 100 $\mu$m. Typically, the depth of focus of the inventive optical alignment means ranges approximately from 50 to 200 $\mu$m, while the optics in conventional optical lithographic alignment systems typically have a depth of focus less than about 5 $\mu$m. It will be understood that the aforementioned optics and alignment mark are used to align one direction in a x-y plane, and that, therefore, a complimentary set of optics and alignment mark typically are used for the orthogonal direction.

Light diffracted by an alignment mark returns through lens section 3 and typically comprises three small diameter beams at the lens. Therefore, properties such as off axis spherical aberration do not degrade the image, and a simple lens can be used without optical penalty. As seen in FIG. 1, the central portion 10 of the returning beam, i.e. the 0th order diffracted light, is returned to the laser and is lost; the +1 and −1 diffracted orders 9,8 are combined at the long lens conjugate and form a frequency doubled image of the grating. As is known to those skilled in the art, because this is an image system, the period of the image is determined by the magnification and not the wavelength of the light. Thus, a multiwavelength HeNe laser could be used to ensure strong signals for all thicknesses of the material levels comprising or covering the grating on the wafer.

Figure 3:
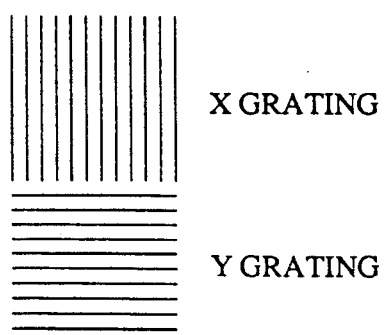
FIG. 3 schematically depicts an exemplary set of orthogonal gratings.

Exemplarily, a Ronchi grating 6, located at the long lens conjugate, is used to combine the +1 and −1 diffracted orders, and is chosen such that the period of the Ronchi grating is the same as that of the diffracted image formed by combining the +1 and −1 diffracted orders of light. The Ronchi grating provides a clear signal for detection by the photodiode 7, such that movement of the wafer in the x-y plane in a direction perpendicular to the wafer grating lines produces a sinusoidal signal from the photodiode. This method of detection is inherently ambiguous: the signal is identical if the wafer is displaced by 1 grating line. This ambiguity may be removed by detecting the last line at the edge of the grating, but, as can be appreciated by those skilled in the art, because of "ringing", due to diffraction effects at the edge of the grating, this line is not always well defined. Instead, the location of the sides of the grating pattern defined by the end of the lines in the wafer grating for the orthogonal direction may be detected. FIG. 3 schematically depicts an exemplary set of orthogonal wafer gratings, which demonstrates the relationship between the last line of a grating and the end of the lines in the grating for the orthogonal direction. The ends of the y grating align with the last line in the x grating, while the ends of the x grating are in a known relationship to the last line in the y grating. These ends are imaged with low resolution since the lens section is narrow and the numerical aperture is small in this direction. However, the signal is a clean one, and the necessary resolution to resolve the ambiguity is readily obtained. Since the ends of a X grating are used to resolve the ambiguity in the y direction, and vice versa, no additional gratings are required. However, it may be desirable to use additional coarse alignment gratings composed of relatively short lines. The optical short line grating used for coarse alignment exemplarily is to be located near the fine alignment grating, producing a signal to be balanced by both photodetectors, each normally used for one direction of wafer movement.

Figure 4:
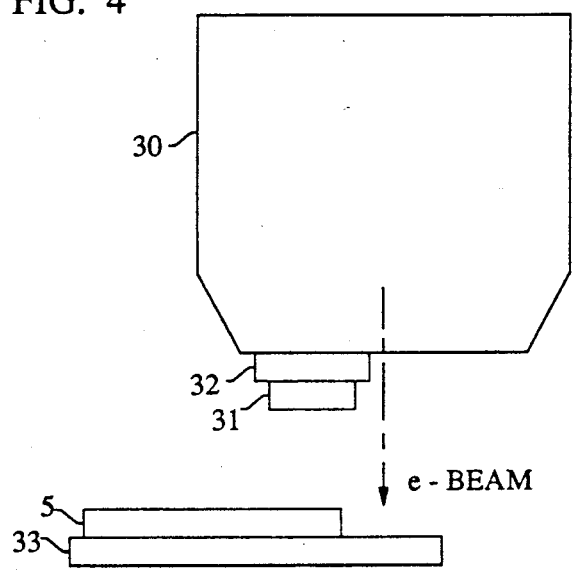
FIG. 4 schematically depicts, in exaggerated form, an exemplary mounting of an optical head to the pole tip of an electron beam exposure tool.

Significantly, the optical head, comprising the lens and mirrors for a X and a Y channel, can typically be mounted to the bottom of the pole tip of a conventional e-beam exposure tool. Attachment of the optical head to the pole tip is exemplarily illustrated in FIG. 4 (in exaggerated form) which indicates that the mounting 32 for the optical elements (as a unit called an optical head 31, with all elements shown as one block in FIG. 4) can typically be made such that at least a portion of the wafer stage 33 is in-line with the center of the electron beam. A typical optical head is thin enough to fit below the pole tip without interfering with the motion of the stage carrying the wafer. Typically, in cross-section, the optical head ranges from 1 mm to 100 mm square, preferably, between 5 mm and 20 mm square, with each element of the optical head having a thickness as small as possible, preferably about 0.25 cm or less, and generally greater than 0.0025 cm. Of course, the optical head is not limited to square cross-sectional structures, but may have any appropriate shape that allows it to be placed between an e-beam tool pole tip and a wafer. The position of the optical head between the pole tip and the wafer is adjusted initially to focus the optical beam. For example, fine focusing within 100 $\mu$m depth of focus is accomplished by turning a spring loaded cam with a probe inserted into the vacuum chamber of an e-beam exposure tool from a port used for input/output of the optical beam.

The Ronchi grating, photodiodes, and laser source can be mounted exterior to the vacuum chamber of the e-beam exposure tool with input light and output diffracted light entering and exiting the vacuum chamber of the e-beam tool through a transparent port. Alternately with proper choice of the optical elements used, the means for providing and detecting light can be mounted interior to the vacuum chamber with electrical connections to the exterior of the vacuum chamber. Additionally, the function of these exterior elements can be realized using other means known to those skilled in the art. For example, photodiodes can be replaced by other types of photodetection devices, and the Ronchi grating and photodiode detector can be replaced by a single slit aperture and a TV camera. For the preferred embodiment, a laser is used as the optical beam source to take advantage of laser directionality, brightness, and narrow beam waist.

The alignment gratings provided on the wafer are small, typically covering a 100 $\mu$m by 200 $\mu$m area. To provide x and y data, an orthogonal set of alignment gratings is necessary. Additionally, the stage movement is perpendicular to the grating lines. As the wafer moves such as to effectively scan the optical beam across the grating lines, positional information is gathered by determining the distance traveled in each direction from various points on the wafer grating. However, to minimize stray diffraction caused by laser beams spilling over from the alignment marks onto the regular IC pattern (which typically has some degree of regularity in two orthogonal directions) the grating lines are made skew to the directions of regularity of the IC pattern. In a particular embodiment, the gratings are skewed by 26°, a pattern easily made, but one that is unlikely to appear in normal features of an IC pattern.

As can be appreciated by those skilled in the art, the operating characteristics of the means used to practice an embodiment of the inventive method, such as the dimensions and period of the wafer grating, the dimensions and optical characteristics of the optical head elements, the dimension and period of the Ronchi grating, the type and wavelength of the laser, and the type of photodiode, can be chosen to fit the particular application of the inventive apparatus and method.

EXAMPLE

A VLSI circuit is fabricated with critical feature lengths of 0.25 $\mu$m defining the gate lengths of metal oxide semiconductor (MOS) type structures. During processing, a resist is patterned with an e-beam exposure tool in accordance with the inventive method. The e-beam tool comprises an interferometric wafer stage having an alignment mark that can be aligned both to an electron beam and an optical beam, a conventional vacuum chamber with conventional means for loading and unloading wafers to be processed, a conventional electron lens column modified to hold an optical head, an optical head, a transparent port to the vacuum system, a mounting exterior to the vacuum chamber holding a multiwavelength HeNe laser, a Ronchi grating, and a silicon photodiode based detector, and computer means for processing alignment data to determine the degree of wafer alignment and for controlling the motion of the stage in response to processing of alignment data.

Figure 5:
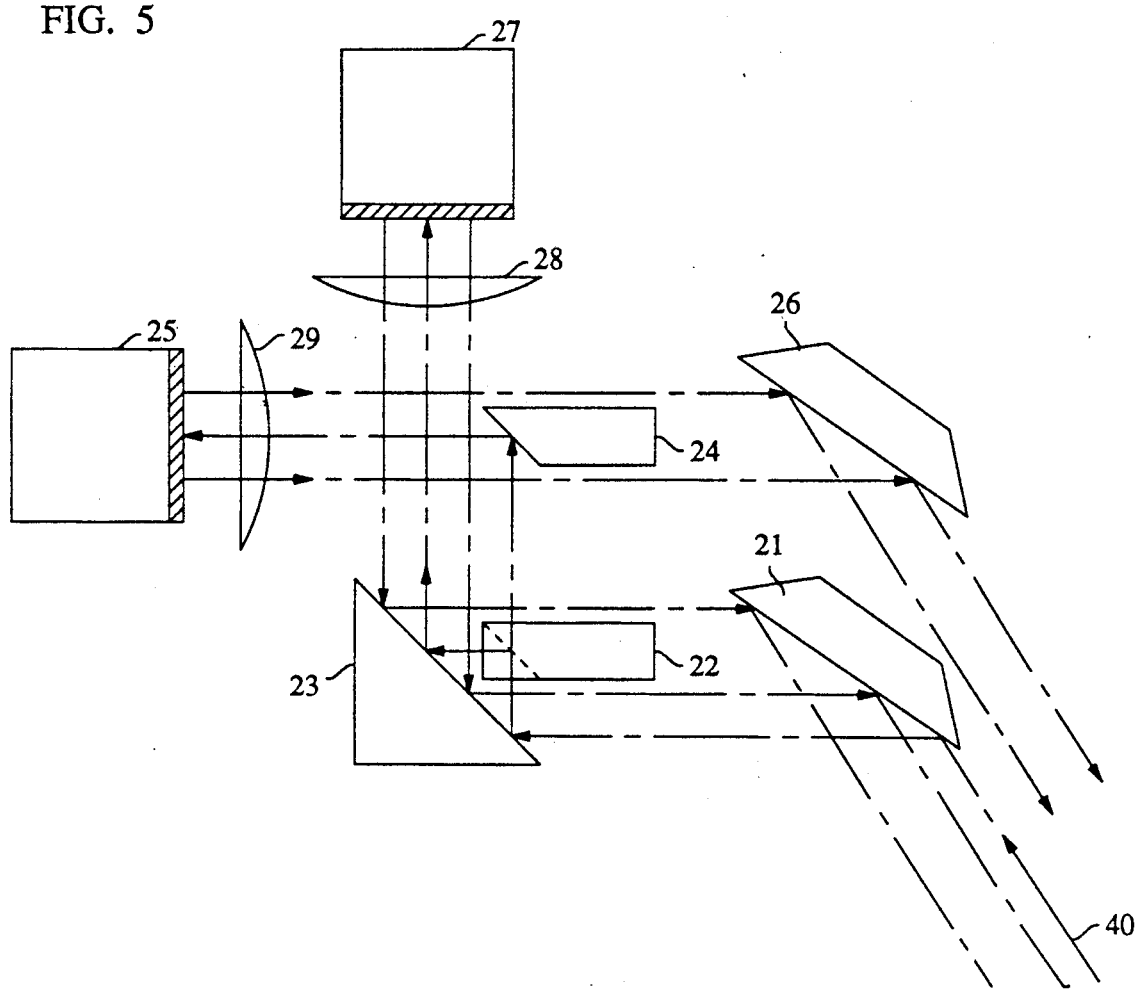
FIG. 5 schematically depicts elements of an exemplary optical head.

The optical head comprises a set of mirrors and lens for both a X and a Y channel. FIG. 5 schematically depicts the optical head. Light from the HeNe laser (not shown) enters the vacuum chamber (not shown) directed along path 40 to the polarizing beam splitter 22 by reflections from the 28.25° mirror 21 and the 45° mirror 23. The beam splitter 22, a section cut from a larger conventional beam splitter, splits the input light into two channels, a X and a Y channel. The light split into the Y channel is reflected from mirror 23, being directed to the lens 28, which focuses the light onto the Y wafer grating through reflection from the 45° mirror 27. The Y wafer grating (not shown) is 120 μm wide 240 μm long with a period of 6 μm. The Y channel light diffracted from the wafer (not shown) is reflected back from mirror 27 through lens 28, and then reflected from mirror 23. As can be seen in FIG. 5, the center portion of the diffracted beam, i.e. the 0th diffracted order, is effectively spatially filtered. A substantial portion of the higher order diffracted light passes by beam splitter 22 such that it is reflected from mirror 21 towards the Y detection means (not shown) where the diffracted light is detected exterior to the vacuum chamber (not shown).

The light split into the X channel by the beam splitter 22 is reflected from the 45° mirror 24, being directed to the lens 29, which focuses the light through reflection from the 45° mirror 25 onto the X wafer grating (not shown), whose dimensions are the same as the Y wafer grating, though the X grating lines are orthogonal to the Y grating lines. The X channel light diffracted from the wafer is reflected from mirror 25 and through lens 29. As can be seen in FIG. 5, the center portion of the diffracted beam, the 0th order diffracted light, is effectively spatially filtered. A substantial portion of the higher order diffracted light passes by mirror 24, reflecting from the 28.25° mirror 26, being directed towards the X detection means (not shown) such that the diffracted light is detected exterior to the vacuum chamber.

The optics within the optical head for both the X and Y channel are mounted on an aluminum plate approximately 10 cm in diameter and about 0.32 cm thick which bolts to the pole tip of the e-beam exposure tool, with no optical element thicker than about 0.5 cm. The optics have a depth of focus of approximately 100 μm.

In accordance with the inventive method, a reference vector defining the e-beam reference axis relative to the optical beam is determined using the alignment marks on the wafer stage. The wafer containing the die for the 0.25 μm VLSI circuit is placed on the wafer stage after several sets of diffraction gratings have been provided on the wafer as alignment marks for a modified global alignment procedure, and after the wafer has been coated with conventional resist material for e-beam exposure using conventional deposition techniques. One orthogonal set of marks is used to align the wafer to the optical beam. Several other alignment marks are provided for verifying alignment. The wafer stage is then moved in a direction defined by the reference vector and the location of the area of the wafer to be exposed relative to the alignment mark. The electron beam is then rastered across the wafer in a predetermined pattern defining a resist masking layer. The wafer is further processed using standard semiconductor processing techniques.

We claim:

1. Method of producing a semiconductor device comprising:
   a) providing a semiconductor body with a processing layer and at least one alignment mark on a major surface of the body;
   b) introducing the body into an electron beam exposure tool, associated with the exposure tool being an electron beam reference axis;
   c) aligning the body with respect to the electron beam reference axis;
   d) exposing, in the exposure tool, a selected portion of the processing layer to an electron beam; and
   e) carrying out one or more further steps toward completion of the semiconductor device;
   characterized in that
   the alignment mark on the body comprises a diffraction grating,
   the electron beam exposure tool comprises optical alignment means, step (c) comprises
   f) aligning the body relative to a beam of optical radiation associated with the optical alignment means, the beam of optical radiation being a predetermined distance in a predetermined direction from the electron beam reference axis; and further comprises
   g) moving the body in the electron beam exposure tool such that the selected portion of the processing layer is aligned to the electron beam reference axis; and
   step f) comprises diffracting light from the alignment mark, with the diffracted light comprising +1,0, and −1 orders of diffraction; spatially filtering the diffracted light, and detecting the +1, −1 diffracted orders of the spatially filtered light.

2. Method of claim 1, wherein detecting the +1, −1 diffracted orders of spatially filtered light comprises directing the light through at least a portion of a Ronchi grating onto one or more photodiodes, the Ronchi grating having double the spatial frequency of the image of the alignment mark on the body.

3. Electron-beam apparatus comprising:
   a) means for generating an electron beam, associated with the electron beam being an electron beam reference axis;
   b) means for rastering the electron beam about the electron beam reference axis; and
   c) a movable stage for holding a semiconductor body;
   characterized in that
   the apparatus further comprises
   d) means for directing a beam of electromagnetic radiation onto a major surface of a semiconductor body placed onto the movable stage, such that when the beam is directed onto an appropriately patterned portion of the surface, electromagnetic radiation is reflected from the surface, the reflected radiation comprising orders of diffraction respectively indexed −1, 0, and +1,
   e) means for directing at least a portion of the reflected radiation towards means for detecting the radiation, and
   f) means for spatially filtering the diffracted radiation such that the 0th order diffracted radiation is substantially eliminated from the radiation that is directed towards the detection means.

4. Apparatus of claim 3, further comprising means for combining the +1 and −1 orders of diffracted radiation.

5. Apparatus of claim 4, wherein the moveable stage is located in a vacuum chamber, and wherein the apparatus further comprises a source of the electromagnetic radiation, both the source and the one or more detectors being located outside of the vacuum chamber.

6. Apparatus of claim 5, wherein the source of electromagnetic radiation comprises a multiwavelength HeNe laser; the optical head comprises a beam splitter to direct the electromagnetic radiation onto the semiconductor body in two orthogonal directions, optical lens with thicknesses between 0.0025 cm and 0.5 cm for focusing the electromagnetic radiation onto the body, and mirrors cut at 45° for directing the electromagnetic radiation from the lens to the body; the moveable stage comprises an interferometric stage; the means for combining the +1 and −1 orders of diffracted radiation comprises a Ronchi grating, the Ronchi grating being located outside the vacuum chamber; and the means for detecting the combined +1 and −1 orders of diffracted radiation comprises photodiodes.

7. Apparatus of claim 3, wherein the electron-beam apparatus comprises an electron lens, associated with the electron lens being a pole tip that is adjacent to but spaced apart from the moveable stage; and wherein the optical head is mounted on the pole tip such that movement of the stage with a semiconductor body thereon in a plane normal to the electron beam reference axis is not restricted by the optical head.

8. Apparatus of claim 7, wherein the optical head comprises a section of a lens having a thickness between 0.0025 cm and 0.5 cm.

9. Apparatus of claim 3, wherein associated with the optical alignment means is a depth of focus, the depth of focus being greater than 1 μm.

* * * * *